United States Patent [19]

Schneider

[11] 3,777,185

[45] Dec. 4, 1973

[54] MINIMIZATION AND LIMITING OF POWER DISSIPATION IN MULTIVIBRATORS AND THE LIKE

[75] Inventor: Herbert Anton Schneider, Boulder, Colo.

[73] Assignee: Bell Telephone Laboratories, Incorporated, Murray Hill, N.J.

[22] Filed: Oct. 18, 1972

[21] Appl. No.: 298,640

[52] U.S. Cl. .................................. 307/291, 307/296

[51] Int. Cl. ............................................ H03k 3/286

[58] Field of Search..................... 307/288, 289, 291, 307/296

[56] References Cited

UNITED STATES PATENTS

| | | | |
|---|---|---|---|
| 3,317,750 | 5/1967 | Narud et al. | 307/291 |
| 3,473,045 | 10/1969 | Niemann | 307/291 X |
| 3,504,201 | 3/1970 | Richardson | 307/291 X |

*Primary Examiner*—John Zazworsky
*Attorney*—W. L. Keefauver et al.

[57] ABSTRACT

Power dissipation in multivibrators and other circuits having first and second cross-coupled transistors is minimized by providing base current for the first transistor from a potential intermediate the collector potential of the second transistor and the emitter potential of the first transistor. Further, power dissipation in conductive output transistors of such circuits is limited to a predetermined maximum value by monitoring each output transistor and maintaining it nonconductive unless the collector-emitter voltage thereof is less than the predetermined maximum.

16 Claims, 3 Drawing Figures

MINIMIZATION AND LIMITING OF POWER DISSIPATION IN MULTIVIBRATORS AND THE LIKE

BACKGROUND OF THE INVENTION

The present invention relates generally to multivibrators and other cross-coupled circuits and, more particularly, to arrangements for minimizing and limiting power dissipation therein.

In cross-coupled circuits, such as the Eccles-Jordan type multivibrator, input current for the conductive transistor (or other active device) is typically taken from the main voltage supply via a cross-coupling resistor which interconnects the collector of the nonconductive transistor and the base of the conductive transistor. Thus, the bias power dissipated in maintaining the circuit in a desired state depends on the product of the supply voltage and the base current in the conductive transistor. Where a large number of circuits are utilized together, in a memory for example, and/or when relatively large power supplies are used, bias power dissipation becomes an increasingly important consideration, both in terms of power waste and heat generation.

In addition, excessive power dissipation in multivibrators and other cross-coupled circuits can arise when output current from the circuit is provided through the collector of a saturated output transistor. If the load impedance becomes too small, the output transistor becomes overloaded and its collector current may increase to the extent that the transistor comes out of saturation. The resultant collector-emitter voltage increase causes increased power dissipation in the output transistor and may lead to damage thereof. While the possibility of such damage can be minimized by using transistors of higher power rating, this increases the cost, bulk and response time of the circuit.

SUMMARY OF THE INVENTION

Accordingly, a general object of the invention is to provide an arrangement for minimizing and limiting power dissipation in multivibrators and other cross-coupled circuits.

A more specific object of the invention is to provide an arrangement for reducing the bias power dissipated in such circuits.

Another object of the invention is to provide an arrangement for limiting output transistor power dissipation in such circuits to a predetermined maximum, thereby protecting the transistors from damage which may arise, for example, from excess output current drain, i.e., overload.

In accordance with a feature of the invention, bias power dissipation in multivibrators and other circuits having first and second cross-coupled transistors is significantly reduced by novel cross-coupling circuitry which provides base current for the first transistor from a potential intermediate the collector potential of the second transistor and the emitter potential of the first transistor. Illustratively, the base of the first transistor is coupled to the intermediate potential via a switch and a resistor connected in series. The switch may be a transistor operative in response to the collector voltage of the second transistor.

In accordance with a further feature of the invention, power dissipation in conductive output transistors of multivibrators and other cross-coupled circuits is limited to a predetermined maximum vlaue by circuitry which monitors each output transistor and maintains it non-conductive unless the collector-emitter voltage thereof is less than the predetermined maximum. Thus, an overloaded output transistor is rendered nonconductive rather than being subjected to possible damage from excess power dissipation.

An important feature of the invention is that the monitor circuit associated with each output transistor operates even when the transistor is nonconductive (and thus is in no danger from excess power dissipation). Thus, advantageously, if an output transistor is rendered nonconductive in response to an overload, the other transistor or transistors in the circuit do not switch, and the circuit returns to its original state once the overload terminates.

In order to enable the nonconductive output transistors to switch when state transitions are to be effected, circuitry is provided according to the invention for disabling the respective monitor circuits thereof during state transition periods.

BRIEF DESCRIPTION OF THE DRAWING

A clear understanding of the invention and of the preceding and other objects and features thereof may be gained from a consideration of the following detailed description and accompanying drawings in which.

DETAILED DESCRIPTION

Figure 1:
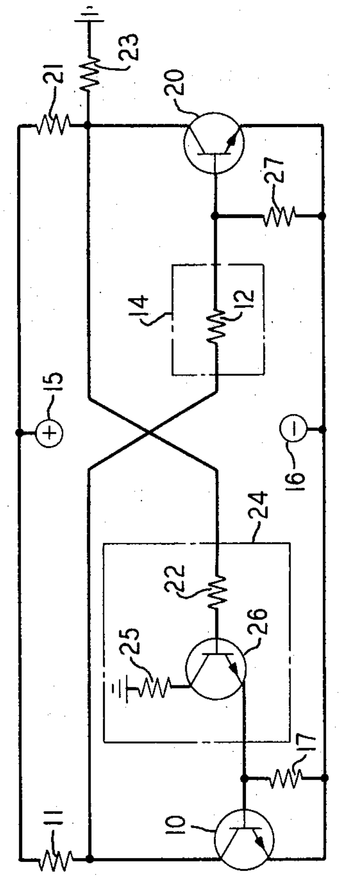
FIG. 1 depicts bias power reduction circuitry in accordance with a feature of the invention, illustratively employed in an Eccles-Jordan multivibrator.

The Eccles-Jordan multivibrator depicted illustratively in FIG. 1 comprises transistors 10 and 20. The output electrodes, illustratively the collectors, of transistors 10 and 20 are coupled to the positive reference of source 15 via resistors 11 and 21, respectively. The common electrodes, illustratively the emitters of transistors 10 and 20, are directly coupled to the negative reference of source 16.

Transistors 10 and 20 are interconnected via cross-coupling circuits 14 and 24. In order to contrast the invention with the prior art, cross-coupling circuit 14 is depicted in FIG. 1 as comprising a conventional cross-coupling resistor 12 interconnecting the collector of transistor 20 and the input electrode, illustratively the base, of transistor 10. Preferably however, cross-coupling circuit 14 should be similar to cross-coupling circuit 24.

Cross-coupling circuit 24, in accordance with the invention, comprises resistors 22 and 25 and transistor 26. Resistor 22 connects the collector of transistor 20 to the base of transistor 26, while resistor 25 connects the collector of transistor 26 to a bias reference potential, illustratively ground, intermediate sources 15 and 16. In addition, the emitter of transistor 26 is connected to the base of transistor 10.

When the multivibrator of FIG. 1 is in a first state with transistor 20 conductive and transistor 10 nonconductive, base current for transistor 20 is provided from sources 15 and 16 via resistor 11 and cross-coupling circuit 14. Thus it is seen that with conventional cross-coupling circuitry, the bias power dissipated in maintaining the multivibrator in its first state is substantially equal to the product of the base current and the full power supply voltage here, the sum of sources 15 and 16. (Power dissipated in base resistor 27 is negligible.)

With the multivibrator of FIG. 1 in a second state, transistor 10 is conductive and transistor 20 is nonconductive. A potential substantially equal to source 15 appears at the collector of transistor 20. That potential, extended to first cross-coupling network 24, ensures that transistor 10 is maintained in conduction. Second cross-coupling network 14 ensures that transistor 20 is nonconductive in response to the conduction of transistor 10.

Specifically, the voltage of source 15 is extended to the base of transistor 26 via resistors 21 and 22. Accordingly, transistor 26 is conductive and base current for transistor 10 flows from ground to source 16 via resistor 25 and transistor 26. Thus, transistor 26 functions as a switch responsive to the collector voltage of transistor 20, for connecting the base of the transistor 10 to ground via resistor 25. Since the base current of transistor 10 is emitter current from transistor 26, the current gain provided by the latter ensures negligible bias current and, hence, negligible bias power dissipation in both resistors 21 and 22. (Power dissipated in resistor 21 by current provided from source 15 to load 23 is the useful load power, not bias power, i.e., power dissipated to maintain the flip-flop in one of its states.)

Thus, the bias power dissipated in maintaining the multivibrator of FIG. 1 in its second state is substantially equal to the product of the transistor 10 base current and source 16. (The power dissipated in base resistor 17 is negligible.) If sources 15 and 16 are of equal magnitude for example, cross-coupling circuit 24 provides a 50 percent reduction in bias power dissipation over (prior art) cross-coupling circuit 14. It will be appreciated that, advantageously, even greater bias power reduction can be realized by returning resistor 25 to a potential closer to source 16 than ground, and by appropriately adjusting the magnitude of resistor 25 to provide the desired base current for transistor 10.

Cross-coupling circuit 24 also provides the multivibrator of FIG. 1 with increased output current capability. Since very little current through resistor 21 is shunted through cross-coupling circuit 24 as bias current, more current through resistor 21 is available to output load 23 than would generally be possible with conventional cross-coupling circuitry such as circuit 14.

Figure 2:
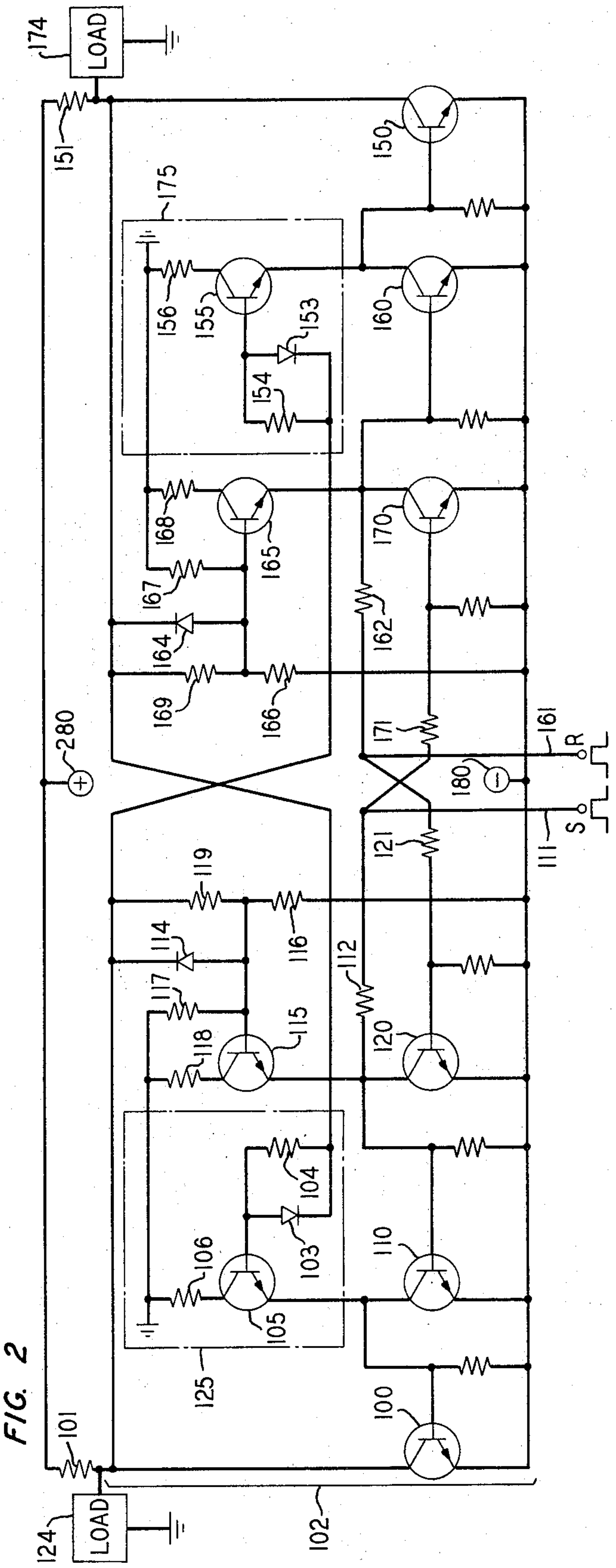
FIG. 2 is an illustrative embodiment which further depicts power dissipation limiting circuitry in accordance with another feature of the invention, also illustratively employed in an Eccles-Jordan multivibrator.

FIG. 2 shows circuitry in accordance with a further feature of the invention, for limiting output transistor power dissipation in multivibrators and other circuits. By way of example, FIG. 2 depicts an Eccles-Jordan multivibrator comprising output transistors 100 and 150. The collectors of transistors 100 and 150 are connected to positive source 280 via resistors 101 and 151, respectively, and their emitters are directly coupled to negative source 180. Transistors 100 and 150 are interconnected via cross-coupling circuits 125 and 175, which are substantially similar to circuit 24 of FIG. 1. Thus, the collector of transistor 100 is coupled to the base of transistor 150 via the network in circuit 175 comprising resistors 154 and 156, and transistor 155; while the collector of transistor 150 is coupled to the base of transistor 100 via the cross-coupling network in circuit 125 comprising resistors 104 and 106 and transistor 105. Diodes 103 and 153 connected in parallel across resistors 104 and 154, respectively are provided to speed up state transitions. As in FIG. 1, the cross-coupling circuitry of FIG. 2 advantageously provides reduced bias power dissipation over conventional cross-coupling arrangements.

Illustratively, the multivibrator of FIG. 2 is switched from its SET state to its RESET state by a positive pulse applied to lead 161, the latter being connected to the base of a triggering transistor 160 via resistor 162. The collector of triggering transistor 160 is connected to the base of transistor 150 while its emitter is connected to source 180. Thus, saturation of triggering transistor 160 by a pulse on lead 161 reduces the base-emitter voltage of transistor 150 below cutin. Transistor 150 becomes nonconductive and the multivibrator is transferred to the RESET state by regenerative action.

In a similar manner, SET circuitry comprising triggering transistor 110 and resistor 112 transfers the multivibrator to its SET state in response to a pulse on lead 111.

Consider the multivibrator to be in its SET state, for example, with transistor 150 in saturation. The current through load 174 is substantially the collector current of transistor 150. Thus, if the impedance of load 174 becomes too small, transistor 150 becomes overloaded; the collector current of transistor 150 may increase to the extent that transistor 150 comes out of saturation. The resultant voltage increase at the collector of transistor 150 will cause increased power dissipation therein and may lead to transistor damage.

This potential problem is obviated by power dissipation limiting circuitry, according to the invention, which monitors transistor 150 and which saturates triggering transistor 160 unless the collector-emitter voltage of transistor 150 is less than a predetermined maximum established therefor. A substantially similar monitor circuit is provided for transistor 100. As explained fully below, nonconduction in one of transistors 100 and 150 resulting from operation of its associated monitor circuit, does not cause conduction in the other. Thus, advantageously, the multivibrator returns to its original state once an overload terminates.

Specifically in FIG. 2, the monitor circuit for transistor 150 comprises transistor 165, diode 164 and resistors 166–169. The emitter of transistor 165 is connected to the base of triggering transistor 160 while its collector is coupled to ground via resistor 168. In addition, the base of transistor 165 is coupled to the collector of transistor 150 via the parallel combination of diode 164 and resistor 169. When transistor 150 is in saturation (and therefore, not overloaded), diode 164 is conductive and the base-emitter voltage of transistor 165 is less than cutin. Accordingly, transistor 165 is nonconductive and its emitter current is zero.

Resistors 166 and 167 comprise a voltage divider between source 180 and ground and establish a potential at the base of transistor 165 slightly below the collector-emitter voltage maximum above which (for anticipated current levels) transistor 150 may be damaged by excess power dissipation. Thus, when that collector-emitter voltage maximum is approached, diode 164 becomes nonconductive. Resistors 166, 167 and 169 are chosen such that when the transistor 150 collector-emitter voltage maximum is attained, base current sufficient for conduction is supplied to transistor 165. Accordingly, the resultant transistor 165 emitter current flows into the base of triggering transistor 160. Transistors 160 and 150 established in conduction and nonconduction, respectively, and damage to the latter resulting from excess power dissipation due to an overload is obviated.

A substantially identical monitor circuit comprising transistor 115, diode 114, and resistors 116-119, is provided for transistor 100. When, as previously assumed, the multivibrator of FIG. 2 is in its SET state with transistor 150 conductive, transistor 100 is of course nonconductive. The collector-emitter voltage of transistor 100 is substantially greater than source 180 and its monitor circuit operates to saturate triggering transistor 110.

Thus, transistor 100 is maintained nonconductive under normal loading of transistor 150 by two independent mechanisms. The first is the nonconduction of transistor 105, established by the saturation voltage at the collector of transistor 150. The second is the conduction of triggering transistor 110, established, as described above, by the transistor 100 monitor circuit comprising transistor 115. Thus, when transistors 150 and 105 become nonconductive and conductive, respectively, in response to operation of the monitor circuit for transistor 150, transistor 100 is nontheless maintained nonconducting by triggering transistor 110. When an overload of transistor 150 terminates, the nonconduction of transistor 100 ensures that, advantageously, transistor 150 returns to conduction and the multivibrator returns to its SET state.

From the preceding discussion, it will be appreciated that an arrangement for disabling for example the transistor 100 monitor circuit, during SET-to-RESET transition periods of the multivibrator, is necessary. Otherwise, transistor 100 will be inhibited by its own monitor circuit from switching to conduction when it is desired to transfer the multivibrator to its RESET state.

In FIG. 2 this disabling circuitry includes bypass transistor 120 and its base resistor 121. The collector of transistor 120 is connected to the base of transistor 110 while its emitter is connected to source 180. Resistor 121 connects lead 161 to the base of transistor 120. When a RESET pulse is applied to lead 161 to saturate triggering transistor 160 and, therefore, render transistor 150 nonconductive, bypass transistor 120 is also saturated, emitter current of transistor 115 being bypassed therethrough. Accordingly, transistor 110 is prevented from conduction and transistor 100 is enabled for conduction in response to the nonconduction and conduction of transistors 150 and 105, respectively.

Once the RESET pulse on lead 161 ends, transistor 120 again becomes nonconductive, and with transistor 100 now conductive, the monitor circuit for transistor 100 is again enabled, ready to render transistor 100 nonconductive in the event of an overload thereof brought on, for example, by excess current through load 124.

In a similar manner, circuitry comprising transistor 170 and resistor 171 disables the monitor circuit for transistor 150 during RESET-to-SET transitions.

Figure 3:
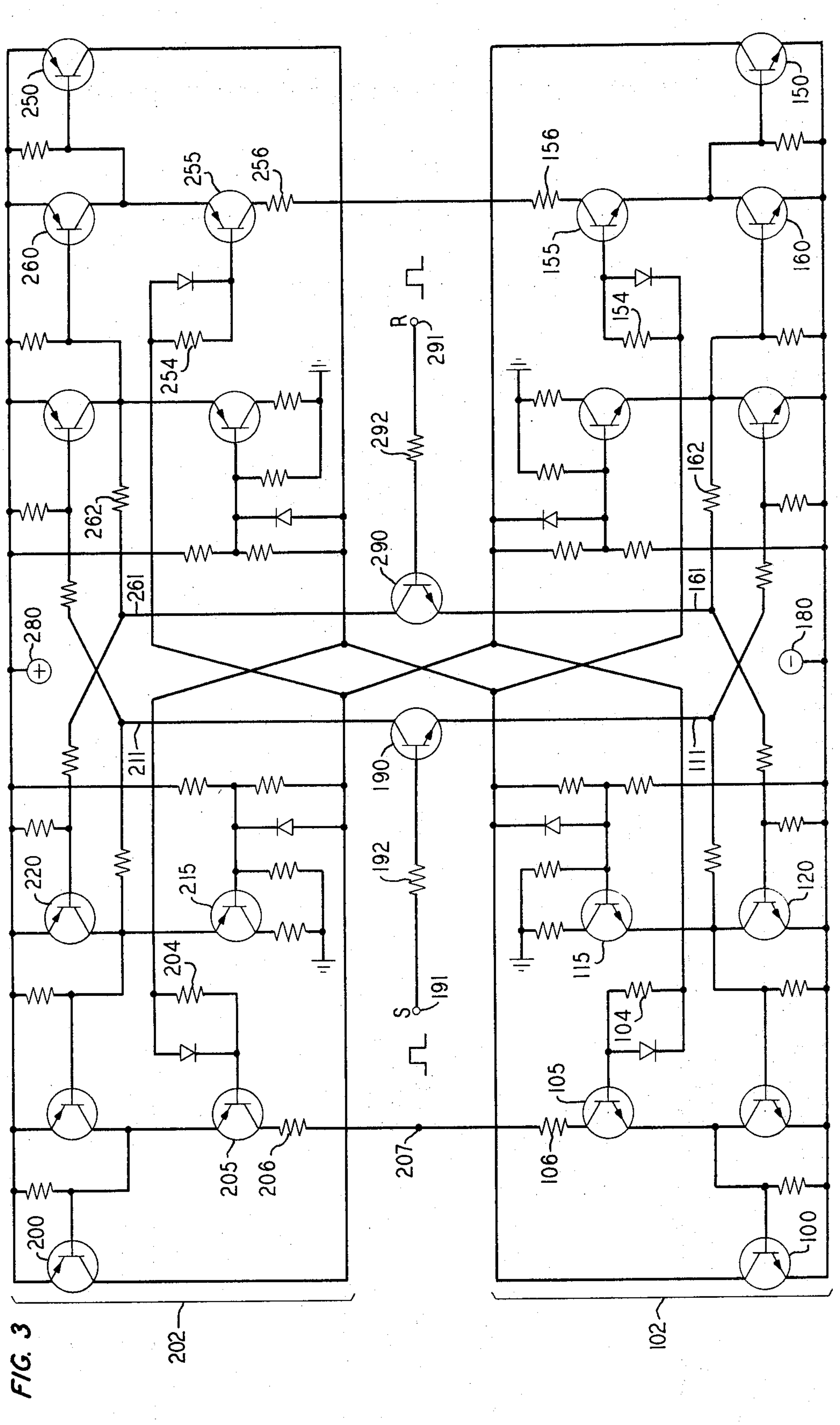
FIG. 3 depicts bias power reduction circuitry and power dissipation limiting circuitry in accordance with the invention, illustratively employed in a cross-coupled circuit comprising complementary transistor pairs.

Although the present invention is illustrated in FIGS. 1 and 2 in conjunction with a bistable multivibrator, it will be appreciated that the principles of the invention are applicable to circuits having one or more astable states as well. Furthermore, the invention may be advantageously utilized in circuits not of the Eccles-Jordan type. FIG. 3, for example, depicts another known cross-coupled circuit, herein referred to as a complementary cell, which includes circuitry according to the invention.

As indicated by brackets, the complementary cell of FIG. 3 comprises upper and lower networks 102 and 202, respectively. Network 102 in FIG. 3 is substantially identical to network 102 in FIG. 2. Accordingly, the elements of network 102 of FIG. 3 have the same reference numerals as the corresponding elements of network 102 in FIG. 2. Network 202 in FIG. 3 is substantially identical to network 102 except that all transistors therein are of the p-n-p type and all diode polarities are reversed. Reference numerals in network 202 begin with the digit "2" but have the same second and third digits as the corresponding elements of network 102.

Loads (not shown) for the complementary cell can be coupled in conventional manner to the collectors of any of transistors 100, 150, 200, or 250 or, where balanced loads are to be employed, between transistors 100 and 200 or between transistors 150 and 250.

Networks 102 and 202 in FIG. 3 are interconnected by leads coupling the collectors of transistors 100 and 150 to the collectors of transistors 250 and 200, respectively. In addition, leads 111 and 211 are interconnected by transistor triggering switch 190. The latter is operative for saturation by SET pulses extended thereto from terminal 191 via base resistor 192. Leads 161 and 261 are interconnected by transistor triggering switch 290. The latter is operative for saturation by RESET pulses extended thereto from terminal 291 via base resistor 292.

When the complementary cell of FIG. 3 is SET, transistors 150 and 250 are conductive. The potential of source 280 is extended via transistor 250 and resistor 154 to the base of transistor 155. Thus, as in FIG. 2, bias power in the complementary cell of FIG. 3 is minimized in accordance with the invention by providing base current for transistor 150 via resistor 156 and transistor 155. Similarly, base current for transistor 250 is provided via resistor 256 and transistor 255, the potential of source 180 being extended to the base of transistor 255 via transistor 150 and resistor 254.

The potentials of sources 180 and 280 are also extended via transistors 150 and 250 to the bases of transistors 105 and 205, respectively, thereby maintaining transistors 105 and 205 and, hence, transistors 100 and 200 nonconductive.

The complementary cell of FIG. 3 can be transferred to its RESET state by switching any one of transistors 100, 150, 200 and 250. (Transistor 250, for example, can be switched from conduction to nonconduction by saturation of its triggering transistor 260.) Regenerative action is thereby initiated, all four transistors switch and a state transition is effected. However, this mode of triggering has several disadvantages. My U. S. Pat. No. 3,679,914, issued on July 25, 1972 discusses these disadvantages and, further, discloses a complementary cell triggering arrangement which avoids them. In accordance with that arrangement, the complementary cell is triggered from a quiescent state by substantially concurrently rendering nonconductive both conducting transistors associated with that state. A positive feedback loop is established thereby which causes the originally nonconductive transistors to become conductive. A state transition is thereby effected.

Thus, in FIG, 3, triggering transistors 160 and 260 concurrently saturate when a RESET pulse provided at terminal 291 saturates transistors 290. Current from sources 180 and 280 flows from the base of transistor 260 to the base of transistor 160 via transistor 290 and resistors 262 and 162 thereby saturating transistors 160 and 260. Accordingly, transistors 150 and 250 become nonconductive. At the same time, bypass transistors 120 and 220 are saturated, thereby disabling the monitor circuits (including transistors 115 and 215) for transistors 100 and 200. The latter thus become conductive via the above-mentioned positive feedback loop and a transition to the SET state is effected.

In similar fashion, the complementary cell of FIG. 3 can be returned to the SET state via application of a set pulse to terminal 191.

Since the same base current flows through triggering transistors 160 and 260, neither can become substantially conductive before the other. Ideally then, transistors 150 and 250 should also be operative for concurrent nonconduction. However, hole storage in p-n-p transistor 250 may result in transistor 150 becoming nonconductive slightly ahead of transistor 250. As transistor 150 becomes nonconductive, its collector rises away from source 180, thus tending to forward bias transistor 105 and urge transistor 100 toward conduction. If transistor 250 is still conductive, transistors 100 and 250 will substantially comprise a short circuit across source 180 and 280. Large collector currents flowing therein may possibly cause transistor damage. Although damage to transistor 250 will ordinarily be prevented by its monitor circuit, the transistor 100 monitor circuit, as described above, is disabled during SET-to-RESET transition periods.

This problem is obviated by interconnecting resistors 106 and 206 at node 207, rather than returning them to ground, thereby preventing either of transistors 105 and 205 from conduction before the other. Since transistor 205 cannot become conductive until transistor 250 becomes nonconductive, transistors 105 and 100 are prevented from conduction until transistor 250 is rendered nonconductive. Potential damage to transistor 100, due to the above-mentioned short circuit condition, is thereby avoided.

Interconnection of resistors 156 and 256 provides similar protection for transistor 150 during RESET-to-SET transitions of the complementary cell.

It is to be understood that the above-described arrangements are merely illustrative of the principles of the invention. Numerous and other varied arrangements in accordance with these principles may readily be devised by those skilled in the art without departing from the spirit and scope of the invention.

I claim:

1. In combination, first and second transistors, means for coupling the emitter of said first transistor to a first potential, first means including an impedance having first and second terminals for cross-coupling said first and second transistors such that said first transistor is maintained in conduction when the collector of said second transistor is at a second potential, and second means for cross-coupling said first and second transistors such that said collector of said second transistor is maintained at said second potential in response to conduction of said first transistor, characterized in that said first cross-coupling means further comprises, means for coupling said first terminal to a potential intermediate said first and second potentials, and switching means for providing a low impedance path between said second terminal and the base of said first transistor.

2. The combination of claim 1 wherein said switching means comprises a switch operative for closure when said collector of said second transistor is at said second potential.

3. The combination of claim 2 wherein said switch comprises a third transistor, the collector and emitter of said third transistor being connected to said second terminal and the base of said first transistor, respectively, and wherein said first cross-coupling means further includes an impedance connecting the collector of said second transistor to the base of said third transistor.

4. The combination of claim 1 further comprising, first monitoring means for maintaining one of said first and second transistors nonconductive unless its collector-emitter voltage is less than a first predetermined maximum, second monitoring means for maintaining the other of said first and second transistors nonconductive unless its collector-emitter voltage is less than a second predetermined maximum, triggering means operative for switching said one transistor from conduction to nonconduction, and means responsive to operation of said triggering means for disabling said second monitoring means.

5. In combination, first and second transistors each having an input electrode, output electrode, and a common electrode, means for coupling the common electrode of said first transistor to a first potential, means for coupling the output electrode of said second transistor to a second potential, first means including an impedance having first and second terminals for cross-coupling the output electrode of said second transistor and the input electrode of said first transistor, and second means for cross-coupling the output electrode of said first transistor and the input electrode of said second transistor, characterized in that said first cross-coupling means further comprises, means for coupling said first terminal to a potential intermediate said first and second potentials, and switching means operative for providing a low impedance path between said second terminal and the input electrode of said first transistor.

6. The combination of claim 5 wherein said first cross-coupling means further comprises means for operating said switch in accordance with the voltage at said output electrode of said second transistor.

7. In combination, a pair of transistors each having an input electrode, an output electrode, and a common electrode, means connecting the output electrodes of each of said transistors to a first reference, means connecting the common electrodes of each of said transistors to a second reference, impedance means coupling the output electrode of each of said transistors to the input electrode of the other of said transistors, characterized in that said impedance means includes means controlled by at least one of said transistors and operative for connecting the input electrode of the other of said transistors to a bias reference, the magnitude of said bias reference being intermediate said first and second references.

8. In combination, first and second transistors, means for connecting the collector of each of said transistors to the base of the other, first monitoring means for maintaining said first transistor nonconductive unless its collector-emitter voltage is less than a first predetermined maximum, second monitoring means for maintaining said second transistor nonconductive unless its collector-emitter voltage is less than a second predetermined maximum, means operative for switching said first transistor from conduction to nonconduction, and means responsive to operation of said switching means for disabling said second monitoring means.

9. The combination of claim 8 wherein said first monitoring means comprises a triggering transistor, the collector and emitter of said triggering transistor being connected to the base and emitter of said first transistor respectively, a monitor transistor, the emitter of said monitor transistor being connected to the base of said triggering transistor, and means including said monitor transistor for establishing said triggering transistor in conduction unless the collector-emitter voltage of said first transistor is less than said first predetermined maximum.

10. The combination of claim 9 wherein said disabling means includes a disabling transistor operative for conduction in response to operation of said switching means, the collector and emitter of said disabling transistor being connected to the emitters of said monitor and triggering transistors, respectively.

11. In combination, first and second transistors, first triggering means operative for switching said first transistor from conduction to nonconduction, first cross-coupling means operative in response to nonconduction in said first transistor for establishing conduction in said second transistor, first circuit means for monitoring the collector-emitter voltage of said first transistor and for maintaining said first transistor nonconductive unless said collector-emitter voltage is less than a predetermined maximum, second circuit means for inhibiting operation of said first cross-coupling means, and means responsive to operation of said first triggering means for disabling said second circuit means.

12. The combination of claim 11 wherein said second circuit means comprises means for monitoring the collector-emitter voltage of said second transistor and for maintaining said second transistor nonconductive unless the collector-emitter voltage of said second transistor is less than a predetermined maximum.

13. The combination of claim 12 further comprising second triggering means for switching said second transistor from conduction to nonconduction, second cross-coupling means operative in response to nonconduction in said second transistor for establishing conduction in said first transistor and means responsive to operation of said second triggering means for disabling said first circuit means.

14. The combination of claim 11 wherein said first circuit means comprises a monitor transistor, means responsive to conduction in said monitor transistor for establishing nonconduction in said first transistor, a diode interconnecting the base of said monitor transistor and the collector of said first transistor, and means for establishing a signal at the base of said monitor transistor corresponding to said predetermined maximum, whereby said monitor transistor is conductive unless said collector-emitter voltage is less than said predetermined maximum.

15. The combination of claim 14 further comprising means for coupling the emitters of said first and second transistors to a first potential and their collectors to a second potential; and wherein said first cross-coupling means comprises an impedance having first and second terminals, means for coupling said first terminal to a potential intermediate said first and second potentials and switching means for providing a low impedance path between said second terminal and the base of said second transistor.

16. In combination, first, second, third and fourth transistors, said first and third transistors comprising a first pair of complementary transistors and said second and fourth transistors comprising a second pair of complementary transistors, means for interconnecting the collectors of said first and fourth transistors and for interconnecting the collectors of said second and third transistors, first cross-coupling means for interconnecting the collector of said second transistor to the base of said first transistor, and second cross-coupling means for interconnecting the collector of said fourth transistor and the base of said third transistor, characterized in that said first and second cross-coupling means respectively comprise fifth and sixth cross-coupling transistors, the emitters of said fifth and sixth transistors being connected to the bases of said first and third transistors respectively, and impedance means for interconnecting the collectors of said fifth and sixth transistors.

* * * * *